United States Patent
Zhao et al.

(10) Patent No.: US 7,888,915 B2
(45) Date of Patent: Feb. 15, 2011

(54) SYSTEM FOR DETECTING GENERATOR WINDING FAULTS

(75) Inventors: Haiqi Zhao, Shanghai (CN); Qimou Xiong, Shanghai (CN); Yanhang Li, Shanghai (CN)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/558,425

(22) Filed: Sep. 11, 2009

(65) Prior Publication Data

US 2010/0277137 A1    Nov. 4, 2010

(51) Int. Cl.
*H02P 9/04* (2006.01)
*H02P 9/48* (2006.01)

(52) U.S. Cl. .............. 322/47; 322/36; 322/37; 290/44

(58) Field of Classification Search ............ 322/24, 322/29, 36, 37, 47; 290/44
See application file for complete search history.

(56) References Cited

U.S. PATENT DOCUMENTS

| | | | |
|---|---|---|---|
| 4,136,312 A | 1/1979 | Salon et al. | |
| 5,798,631 A * | 8/1998 | Spee et al. | 322/25 |
| 6,072,302 A * | 6/2000 | Underwood et al. | 322/17 |
| 6,172,509 B1 | 1/2001 | Cash et al. | |
| 6,236,227 B1 | 5/2001 | Kliman et al. | |
| 6,380,719 B2 * | 4/2002 | Underwood et al. | 322/36 |
| 6,411,065 B1 * | 6/2002 | Underwood et al. | 322/20 |
| 6,882,173 B1 | 4/2005 | Nelson et al. | |
| 7,239,036 B2 | 7/2007 | D'Atre et al. | |
| 7,253,537 B2 | 8/2007 | Weng et al. | |
| 7,372,174 B2 * | 5/2008 | Jones et al. | 290/44 |
| 7,531,910 B2 * | 5/2009 | Flottemesch et al. | 290/44 |
| 7,692,323 B2 * | 4/2010 | Ichinose et al. | 290/44 |
| 7,786,608 B2 * | 8/2010 | Menke | 290/44 |
| 2009/0033357 A1 | 2/2009 | Lindsey et al. | |

OTHER PUBLICATIONS

Hofmann et al.; Control of a Double-Fed Induction Generator for Wind-Power Plants; undated.

* cited by examiner

*Primary Examiner*—Nicholas Ponomarenko
(74) *Attorney, Agent, or Firm*—Fletcher Yoder

(57) ABSTRACT

A system includes an induction generator controller configured to operate an induction generator via a converter. The induction generator controller includes a diagnostic mode configured to instruct the converter to send an input signal to a rotor of the induction generator, receive an output signal from the rotor and a stator of the induction generator, and identify winding faults within the rotor and/or the stator based on the output signals.

15 Claims, 5 Drawing Sheets

SYSTEM FOR DETECTING GENERATOR WINDING FAULTS

BACKGROUND OF THE INVENTION

The subject matter disclosed herein relates to a system for detecting generator winding faults.

Certain wind turbines include a double-fed induction generator (DFIG) to convert wind energy into electrical energy. As blades of the wind turbine rotate, the blades drive a rotor to rotate with respect to a stator, thereby producing electrical energy. DFIGs are generally electrically coupled to a converter that regulates a flow of electrical power between the DFIG and an electrical grid. Specifically, the converter enables the wind turbine to output electrical power at the grid frequency regardless of the rotational speed of the wind turbine blades.

Induction generators in general, and DFIGs in particular, include wire windings within the rotor and the stator. In operation, a rotating magnetic field is established between these windings, thereby inducing an output electric current. Unfortunately, the windings of the rotor and/or the stator may be exposed to high current loads (i.e., greater than design loads) during operation. Such high currents may degrade the insulation between windings, thereby forming a turn fault (i.e., short between windings), or a ground fault (i.e., short between one or more windings and an electrical ground). Such winding faults may decrease the efficiency of the DFIG. Therefore, inspection and maintenance of the DFIG may be performed at regular intervals to mitigate this loss in efficiency. A typical inspection technique involves manually measuring the resistance of each winding within the rotor and the stator using a micro-ohm meter. Such an operation generally requires an operator to climb the wind turbine tower, enter the nacelle, and connect the micro-ohm meter to the DFIG. Because this procedure is both expensive and time-consuming, it is generally performed at longer than desired time intervals. Consequently, wind turbines may operate in an inefficient manner for significant periods. In addition, the micro-ohm meter may fail to identify winding faults in certain cases.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a system includes an induction generator including a rotor and a stator. The system also includes a converter electrically coupled to the induction generator and configured to regulate a flow of electrical power between the induction generator and an electrical grid. The system further includes a controller electrically coupled to the induction generator and the converter. The controller is configured to operate the converter selectively in an electrical power generation mode and a diagnostic mode. The diagnostic mode of the controller is configured to instruct the converter to send an input signal to the rotor, receive an output signal from the rotor and the stator, and identify winding faults within the rotor and/or the stator based on the output signals.

In a second embodiment, a system includes an induction generator controller configured to operate an induction generator via a converter. The induction generator controller includes a diagnostic mode configured to instruct the converter to send an input signal to a rotor of the induction generator, receive an output signal from the rotor and a stator of the induction generator, and identify winding faults within the rotor and/or the stator based on the output signals.

In a third embodiment, a system includes a machine-readable medium and power generation instructions disposed on the machine-readable medium. The power generation instructions are configured to operate an induction generator. The system also includes diagnostic instructions disposed on the machine-readable medium. The diagnostic instructions include instructions to disconnect the induction generator from an electrical grid, instructions to send a balanced alternating current (AC) voltage to a rotor of the induction generator, instructions to receive a current from the rotor, instructions to receive a voltage from a stator of the induction generator, instructions to detect a winding fault within the rotor based on the received current, and instructions to detect a winding fault within the stator based on the received voltage.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
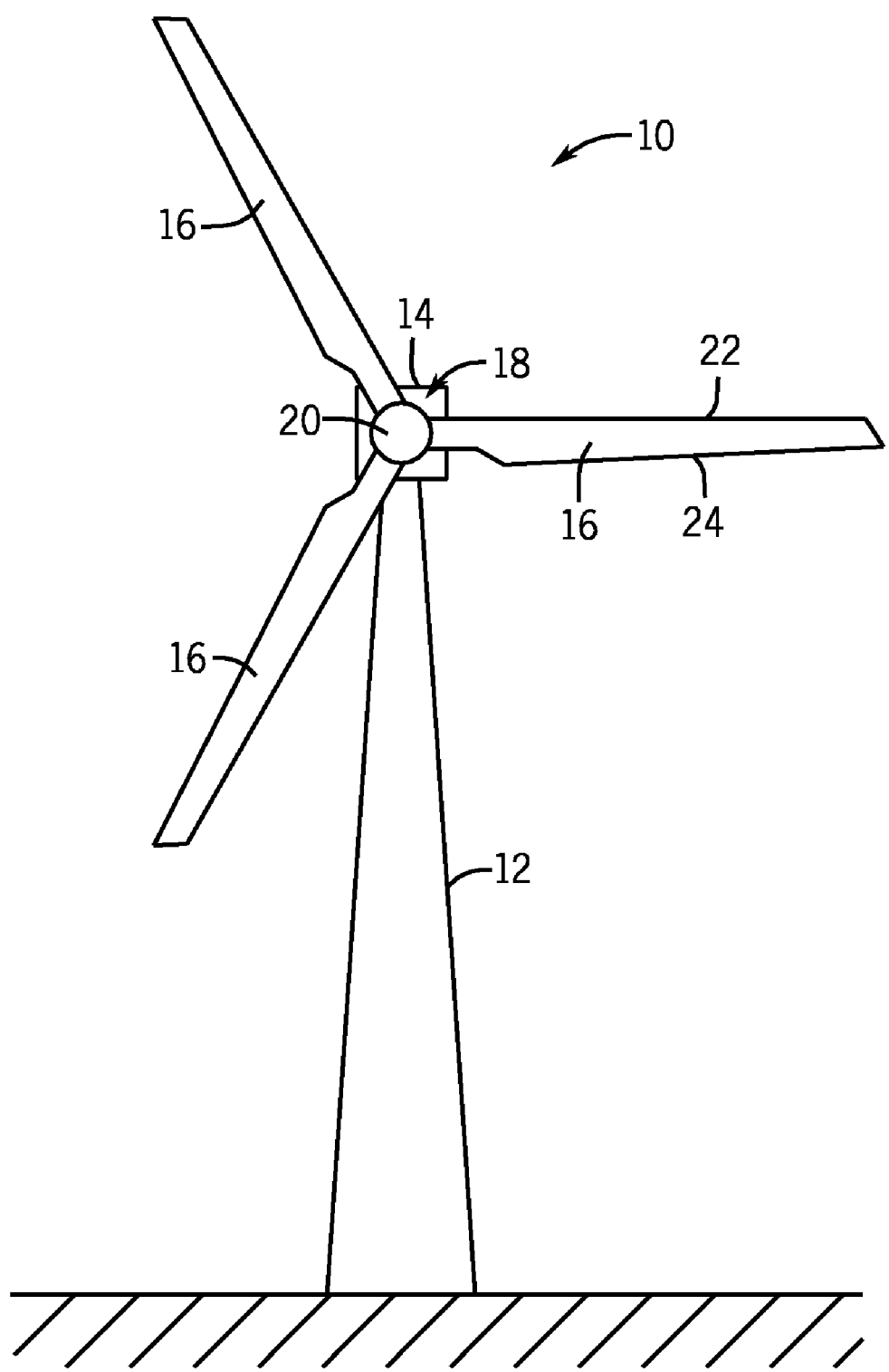
FIG. 1 is a front view of a wind turbine system that may employ an induction generator controller configured to detect winding faults within an induction generator in accordance with certain embodiments of the present technique.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Embodiments of the present disclosure may facilitate remote testing and diagnosis of double-fed induction generators (DFIGs) within a nacelle of a wind turbine. Specifically, a controller which regulates a flow of electrical power between the DFIG and an electrical grid during a power generation mode may serve to detect winding faults within the DFIG during a diagnostic mode. In certain embodiments, the controller is electrically coupled to the DFIG and a converter. The controller is configured to operate the converter during the power generation mode such that the DFIG outputs electrical power at the grid frequency regardless of rotational speed of the wind turbine blades. In addition, the controller is configured to instruct the converter to send an input signal to a rotor of the DFIG, receive an output signal from the rotor and a stator of the DFIG, and identify winding faults within the rotor and/or the stator based on the output signals during the diagnostic mode. In certain embodiments, the input signal is a balanced (alternating current) AC voltage, the output signal from the rotor is an AC current, and the output signal from the stator is an AC voltage. The controller may be configured to identify winding faults within the rotor and/or stator based on detection of an imbalance within the output signals.

Because certain DFIG controllers are configured to instruct the converter to output a signal to the DFIG and measure currents and voltages within the DFIG, no additional hardware outside of the controller may be provided to detect winding faults. In other words, the present embodiment may be employed by reconfiguring or retrofitting the controller to perform the desired diagnostic steps. For example, in certain configurations, a controller programmed to operate the DFIG in the power generation mode may be reprogrammed to operate the DFIG in both the power generation mode and diagnostic mode. As will be appreciated, reprogramming may involve providing the controller with a new computer-readable medium (e.g., removable magnetic or optical disk, memory chip, etc.) including instructions for operating the DFIG in the diagnostic mode. Alternatively, instructions disposed on a computer-readable medium within the controller (e.g., magnetic or solid-state hard drive) may be updated to include instructions for operating the DFIG in the diagnostic mode. In an alternative embodiment, a controller configured to operate the DFIG only in the power generation mode may be replaced (e.g., by a retrofit kit) with a controller configured to operate the DFIG in both the power generation mode and the diagnostic mode. In a further embodiment, the wind turbine system may originally include a controller configured to operate the DFIG in both the power generation mode and the diagnostic mode. In the above-described configurations, implementation costs may be significantly reduced compared to systems involving installation of specialized diagnostic equipment. Furthermore, because testing and diagnosis of the DFIG may be performed remotely (via an interface with the controller), diagnostic costs may be reduced compared to manually measuring the resistance of each winding within the rotor and the stator using a micro-ohm meter. The cost reduction may facilitate increased diagnostic frequency, thereby identifying inefficient wind turbine operation earlier.

FIG. 1 is a front view of a wind turbine system 10 configured to convert wind energy into electrical energy. The wind turbine system 10 includes a tower 12, a nacelle 14 and blades 16. The blades 16 are coupled to a generator 18 within the nacelle 14 by a hub 20 that rotates with the blades 16. The blades 16 are particularly configured to convert the linear air flow from the wind into rotational motion. As the blades 16 rotate, the coupling between the hub 20 and the generator 18 within the nacelle 14 drives the generator 18 to rotate, thereby producing electrical energy. While three blades 16 are included in the wind turbine system 10 of the present embodiment, alternative embodiments may include more or fewer blades 16. For example, certain embodiments may include 2, 3, 4, 5, 6, 7, 8, or more blades 16.

Each blade 16 includes a leading edge 22 and a trailing edge 24. The air flow engages the leading edge 22 and flows toward the trailing edge 24. Due to the shape of the blades 16, aerodynamic forces caused by the flow induce the blades 16 to rotate, thereby driving the generator 18 to produce electrical power. Efficiency of the wind turbine system 10 is at least partially dependent upon converting linear air flow into rotational energy. Therefore, the blades 16 are particularly configured to efficiently transfer wind energy into rotational motion. For example, blade shape may be selected to enhance air flow over the blade 16 such that aerodynamic forces induce the blade 16 to rotate. In addition, the blades 16 are typically manufactured to be substantially smooth, such that air flows over the blades 16 without interference.

In the present embodiment, the generator 18 is a double-fed induction generator (DFIG). As will be appreciated, other induction generator configurations, such as single-fed induction generators, may be employed in alternative embodiments. As discussed in detail below, a DFIG includes a rotor and a stator. The rotor is coupled to the blades 16 by the hub 20, and rotates as the blades 16 are driven by the wind. Both the rotor and stator include a series of wire windings configured to establish a rotating electromagnetic field. As the rotor is driven to rotate by the blades 16, interaction between the magnetic field of the rotor and the magnetic field of the stator induces an electrical current to flow from the stator and/or the rotor to an electrical power grid, thereby producing electrical energy.

During operation of the wind turbine system 10, the speed at which the rotor rotates may vary based on the wind speed. Therefore, the DFIG is coupled to a converter configured to regulate the flow of electrical energy between the generator and the grid. As discussed in detail below, the converter is configured to provide an output frequency from the DFIG that substantially corresponds to the grid frequency (e.g., 50 Hz, 60 Hz, etc.) regardless of rotation speed of the rotor. Specifically, the converter is electrically coupled to a controller that instructs the converter to vary a voltage frequency within the rotor based on rotor rotation speed.

In the present embodiment, the controller also includes instructions for operating the DFIG in a diagnostic mode configured to detect winding faults within the rotor and/or the stator. The controller first disconnects the DFIG from the grid and instructs the converter to send an input signal to the DFIG. The controller then receives an output from the rotor and/or the stator, and analyzes the signals to determine whether a winding fault is present. Because the controller is already configured to instruct the converter to send signals to the generator and receive signals from the generator, no additional hardware or connections may be employed for the controller to detect winding faults. Therefore, configuring the controller to detect winding faults may be significantly less expensive than alternative methods of generator inspection. For example, one inspection method involves an operator climbing the wind turbine tower 12, entering the nacelle 14, and connecting a micro-ohm meter to the DFIG. Because this procedure is both expensive and time-consuming, it is generally performed at longer than desired time intervals. In contrast, a method employing the controller to inspect the windings within the DFIG may be performed remotely and more frequently, thereby providing an earlier indication of inefficient wind turbine system operation. As will be appreciated, the wind turbine system 10 merely represents an exemplary application of the presently described DFIG and controller. Consequently, further embodiments may employ the DFIG and controller within alternative power generation systems.

Figure 2:
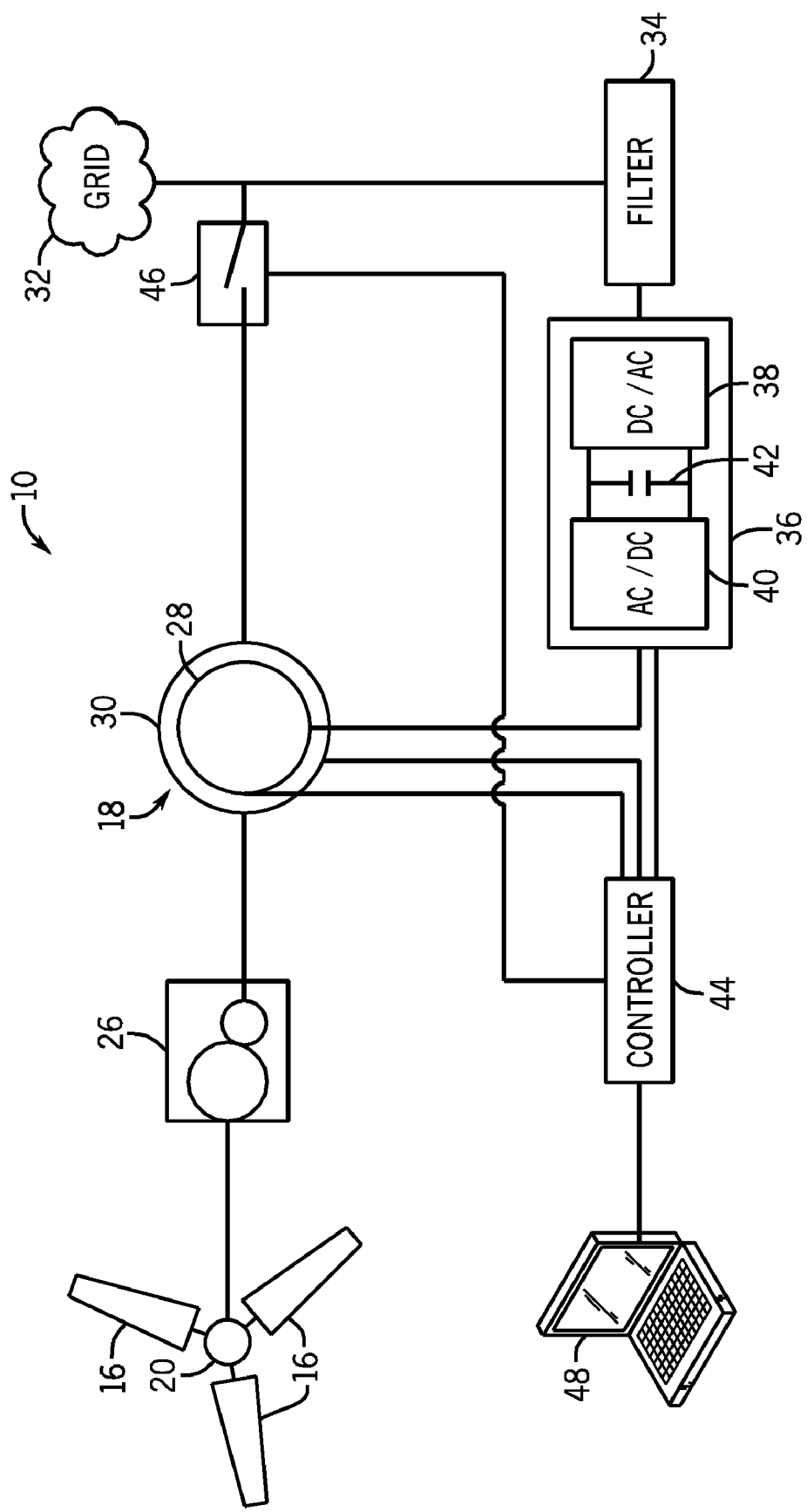
FIG. 2 is a schematic diagram of the wind turbine system, as shown in FIG. 1, in accordance with certain embodiments of the present technique.

FIG. 2 is a schematic diagram of the wind turbine system 10, including the DFIG 18. As illustrated, the wind turbine hub 20 is coupled to a gearbox 26. The gearbox 26 is configured to convert a slower rotational speed of the blades 16 to a faster rotational speed for the DFIG 18. For example, depending on blade configuration and wind speed, the hub 20 may rotate at approximately between 10 to 50, 20 to 40, 25 to 35, or about 30 RPM. In contrast, the DFIG 18 may be configured to generate electrical power within an operating range of approximately between 500 to 4000, 1000 to 3500, 1000 to 3000, 1000 to 2500, or about 1000 to 2000 RPM. Consequently, the gearbox 26 may provide a gear ratio of approximately 10:1, 20:1, 30:1, 40:1, 50:1, 60:1, 70:1, or more.

The gearbox 26, in turn, is coupled to a rotor 28 of the DFIG 18. As previously discussed, the rotor 28 is configured to rotate within a stator 30 to produce electrical power. Specifically, both the rotor 28 and the stator 30 include electrical windings. As will be appreciated, current flowing through the electrical windings of the rotor 28 and the stator 30 generates corresponding magnetic fields. Interaction between the magnetic fields of the rotor 28 and stator 30 induce a current within the rotor 28 and/or the stator 30 as the rotor 28 is driven to rotate by the gearbox 26. As discussed in detail below, these currents are provided to an electrical power grid 32, thereby producing electrical energy.

As illustrated, the stator 30 is directly coupled to the grid 32 (via a switch 46). Consequently, the stator magnetic field rotates at a speed corresponding to the grid frequency. For example, in certain embodiments, the grid frequency may be approximately 50 Hz, 60 Hz, or any other desired operating frequency. Furthermore, the rotor 28 is electrically coupled to the grid 32 by a filter 34 and a converter 36. The converter 36 is configured to vary the frequency supplied to the rotor 28 such that the resultant stator magnetic field rotates at a speed corresponding to the grid frequency. Specifically, the DFIG 18 may operate in one of three modes, subsynchronous, synchronous, and oversynchronous. As will be appreciated, the synchronous speed of a DFIG 18 may be determined by the number of poles within the rotor 28 and stator 30, and the frequency at which the DFIG 18 outputs electrical power. Specifically, the synchronous speed N may be determined according to the following formula:

$$N = \frac{F \cdot 120}{P}$$

where F is the frequency output by the DFIG 18, and P is the number of poles within the rotor 28 and stator 30. For example, if the DFIG 18 is operating at 50 Hz and includes 4 poles within the rotor 28 and stator 30, the synchronous speed N may be approximately 1500 RPM. As will be appreciated, alternative DFIGs 18 may include more or fewer poles. For example, certain DFIGs may include 2, 4, 6, 8, 10, 12, 14, 16, or more poles.

If the rotor 28 is driven to rotate at a speed less than the synchronous speed, the DFIG 18 is operating within the subsynchronous mode. Conversely, if the rotor 28 is driven to rotate at a speed greater than the synchronous speed, the DFIG 18 is operating within the oversynchronous mode. The converter 36 is configured to vary a frequency supplied to the rotor 28 to compensate for the difference in rotational speed such that the resultant magnetic field from the rotor 28 rotates at the synchronous speed. In this manner, the stator 30 will output a frequency equal to the grid frequency. Specifically, when the DFIG 18 is operating within the subsynchronous mode, the converter 36 converts the grid frequency into a slip frequency for the rotor 28. As will be appreciated, the slip frequency is the frequency applied to the rotor 28 to increase the rotation speed of the rotor magnetic field to the synchronous speed. For example, if the rotor 28 is rotating at 1200 RPM, a slip frequency may be applied to the rotor 28 to increase the rotational speed of the rotor magnetic field to 1500 RPM (i.e., the synchronous speed). In other words, a frequency may be applied to the rotor 28 to induce a 300 RPM rotating magnetic field. Based on the above equation and assuming a 4 pole DFIG 18, a 10 Hz slip frequency may be applied to the rotor 28 to increase the rotational speed of the magnetic field to match the output frequency of the stator 30. In this manner, the stator 30 may output a frequency substantially equal to the grid frequency regardless of hub rotation speed below the synchronous speed.

As will be appreciated, the power output from the DFIG 18 may decease during periods of subsynchronous operation. Specifically, the converter 36 will draw electrical power from the grid 32 to drive the rotor 28 at the slip frequency. In certain configurations, the reduction in power is proportional to the slip frequency. In other words, higher slip frequencies employed to compensate for lower hub rotation speeds may draw more current than lower slip frequencies. The larger current draw decreases the total power output from the DFIG 18.

In contrast, the oversynchronous mode may generate additional power output from the DFIG 18. When the rotor 28 rotates faster than the synchronous speed, energy may be taken from the rotor 28 to reduce the rotation rate of the rotor magnetic field. In this manner, the rotation rate of the rotor magnetic field may substantially coincide with the stator magnetic field such that the stator 30 outputs a frequency substantially similar to the grid frequency. Specifically, the converter 36 establishes a frequency within the rotor 28 that causes the rotation rate of the rotor magnetic field to slow to the synchronous speed. As will be appreciated, because the rotor 28 is rotating faster than its magnetic field, the rotor 28 will generate an electrical output. The converter 36 then converts the output frequency of the rotor 28 to a frequency substantially equal to the grid frequency. The additional power output by the rotor 28 may be proportional to the speed at which the rotor 28 is rotating above the synchronous speed. In other words, the faster the hub 20 rotates, the more electrical power output from the DFIG 18.

As illustrated, the converter 36 includes a grid-side converter (DC/AC) 38, a generator-side converter (AC/DC) 40 and a direct voltage intermediate circuit 42. In certain embodiments, both the grid-side converter 38 and the generator-side converter 40 include multiple high speed switches, such as insulated gate bipolar transistors (IGBTs), which are operated to control the power conversion. In the present embodiment, a controller 44 is coupled to the converter 36 and configured to control operation of the internal switches such that the converter 36 outputs an appropriate signal. As previously discussed, the converter 36 of the present embodiment is configured to flow current both toward and away from the rotor 28. For example, during subsynchronous operation, the controller 44 operates the switches within the grid-side converter 38 to convert the grid frequency input into a direct current (DC) output. As will be appreciated, converting an AC signal into a DC signal may cause variations or "ripples" within the DC output. Consequently, the direct voltage intermediate circuit 42, which may include one or more capacitors or other components, functions to smooth such variations to provide a substantially constant voltage signal to the generator-side converter 40. In turn, the controller 44 operates the switches within the generator-side converter 40 to convert the DC signal from the direct voltage intermediate circuit 42 into an AC current substantially equal to the slip frequency of the rotor 28. In this manner, the stator 30 may output a frequency substantially equal to the grid frequency despite the less than synchronous rotation speed of the rotor 28.

Conversely, during oversynchronous operation, the controller 44 operates the switches within the generator-side converter 40 to establish a frequency within the rotor 28 that causes the rotation rate of the rotor magnetic field to slow to the synchronous speed. As previously discussed, during oversynchronous operation, current flows from the rotor 28 to the converter 36. Consequently, the generator-side converter 40 converts the frequency output from the rotor 28 into a DC signal. Similar to the conversion of grid frequency to DC output, the signal output from the generator-side converter 40 may include current variations that are smoothed by the direct voltage intermediate circuit 42. The controller 44 then operates the switches within the grid-side converter 38 to convert the DC signal from the direct voltage intermediate circuit 42 into an AC current having a frequency substantially equal to the grid frequency. In this manner, the frequency output from the rotor 28 is converted to the grid frequency during oversynchronous operation regardless of rotor speed.

As illustrated, the filter 34 is disposed between the converter 36 and the grid 32. As will be appreciated, the filter 34 is configured to substantially reduce variations within the AC signal output from the converter 36 during oversynchronous operation. The filter 34 may include a dv/dt filter (e.g., inductance/capacitance (LC) filter), a line reactor and/or a line filter, for example. Such filtering elements may substantially reduce current and voltage harmonics, and limit overvoltages.

As previously discussed, the controller 44 is configured to operate switches within the converter 36 to properly convert the grid frequency into the rotor slip frequency during subsynchronous operation, and convert rotor output frequency into the grid frequency during oversynchronous operation. As will be appreciated, the controller 44 may be configured to monitor parameters of the DFIG 18 to determine operation mode (i.e., synchronous, subsynchronous, or oversynchronous) and proper conversion frequencies. Specifically, the controller 44 is configured to monitor both the current and voltage within the rotor 28 and stator 30. The controller 44 may also be configured to analyze these signals to determine voltage and current frequencies within the DFIG 18.

Because the controller 44 is configured to monitor voltage and current within the rotor 28 and stator 30, the controller 44 may function to detect winding faults within the DFIG 18 without any additional components outside of the controller 44. As previously discussed, both the rotor 28 and the stator 30 include windings of conductive wires. Over time, insulation surrounding these conductive wires may degrade, establishing a turn fault (i.e., short between windings), or a ground fault (i.e., short between one or more windings and an electrical ground). Such winding faults may decrease efficiency of the DFIG 18. Consequently, the controller 44 may be configured to periodically, or when commanded by an operator, transition the wind turbine system 10 from a power generation mode into a diagnostic mode such that winding faults may be detected.

As discussed in detail below, when the controller 44 engages the diagnostic mode, the controller 44 may first open the switch 46 disposed between the stator 30 and the grid 32, thereby disconnecting the stator 30 from the grid 32. The controller 44 may then instruct the converter 36 to provide the rotor 28 with a balanced AC voltage. With the rotor 28 receiving the desired input signal, the controller 44 may monitor the current output from the rotor 28 and/or the voltage output from the stator 30. If the controller 44 detects an unbalanced signal from either component, a winding fault may be present. Specifically, if the current output from the rotor 28 is unbalanced, the rotor 28 may contain a winding fault. Similarly, if the voltage output from the stator 30 is unbalanced, the stator 30 may contain a winding fault. In further embodiments, the controller 44 may be configured to instruct the converter 36 to output signals consistent with the power generation mode. In such embodiments, the wind turbine system 10 may continue to generate electrical power during the diagnostic mode, while the controller 44 detects winding faults based on the output signals from the rotor 28 and stator 30.

The controller 44 may output the results of this diagnostic to a data processing unit, such as the illustrated computer 48. The computer 48 may include a human-machine interface (HMI) configured to notify an operator of the winding fault. In certain configurations, the HMI may include a plot or other useful representation of the signal output from the rotor 28 and/or the stator 30. In this manner, an operator may determine the extent of the fault and/or a proper course of action to mitigate or repair the winding fault. For example, by analyzing a graph of amplitude versus time, an operator may be able to identify the winding fault as a turn fault or a ground fault. In certain embodiments, the computer 48 may also be utilized to activate the diagnostic mode and/or reengage the power generation mode. Once the diagnostics have been completed, the controller 44 may close the switch 46, thereby connecting the stator 30 to the grid 32. The controller 44 may then instruct the converter 36 to enter the power generation mode. As will be appreciated, the computer 48 may be housed within a location remote from the wind turbine system 10. Because such diagnostic operations may be performed remotely, the present configuration may significantly reduce maintenance costs compared to manual inspection and testing of the rotor 28 and stator 30.

Figure 3:
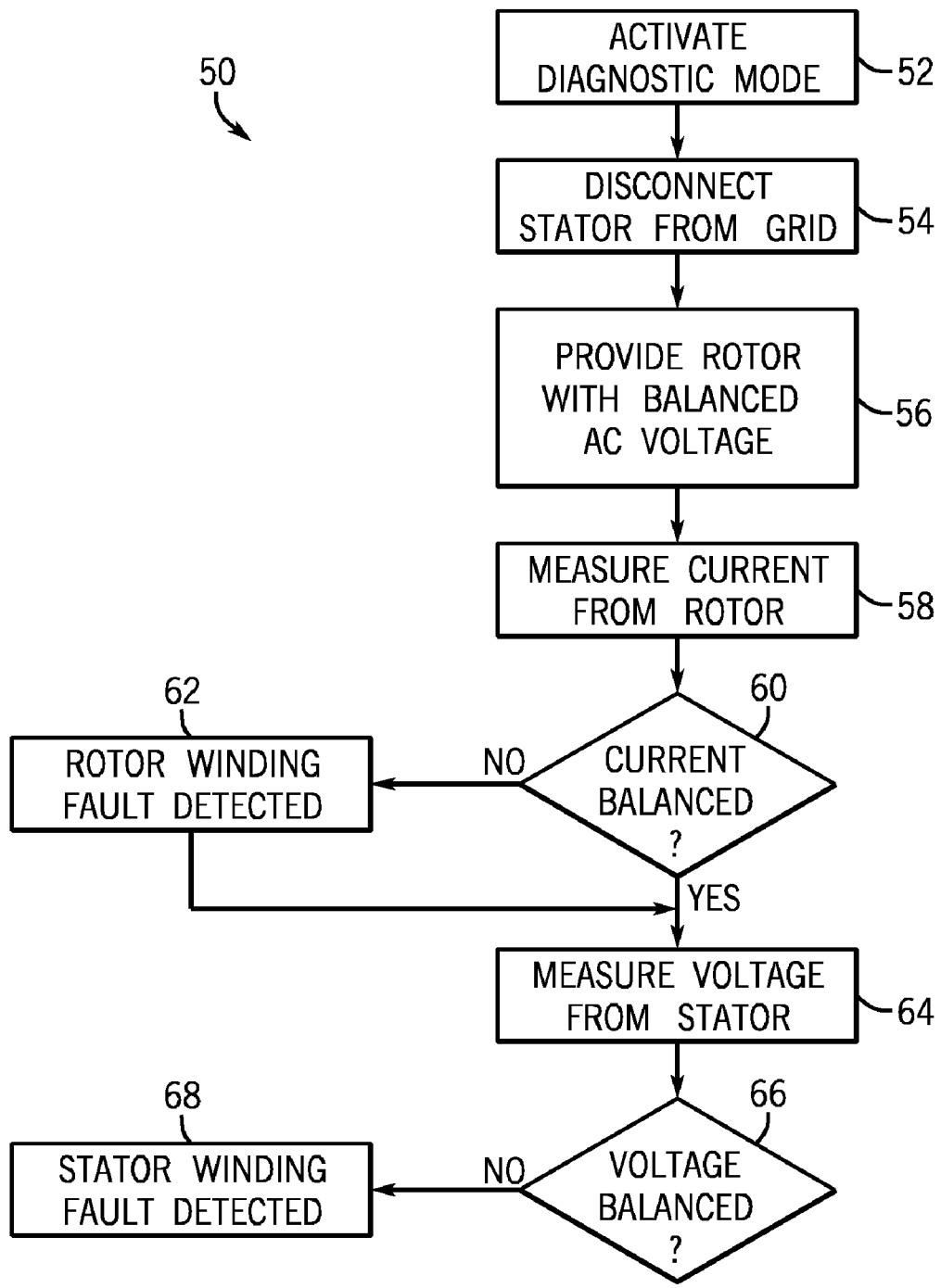
FIG. 3 is a flow chart of a method for detecting winding faults within the induction generator in accordance with certain embodiments of the present technique.

FIG. 3 is a flow chart of a computer-implemented method 50 for detecting winding faults within the DFIG 18. The illustrated steps may be performed by instructions stored in a machine-readable medium or memory of the controller 44 or other computer. As previously discussed, an operator may instruct the wind turbine system 10 to enter a diagnostic mode, as represented by block 52. For example, the operator may enter commands into the HMI instructing the controller 44 to engage the diagnostic mode. Alternatively, the controller 44 or computer 48 may be configured to automatically activate the diagnostic mode periodically based on a maintenance schedule.

Once the diagnostic mode has been activated, the controller 44 may first open the switch 46, thereby disconnecting the stator 30 from the grid 32, as represented by block 54. The controller 44 may then instruct the converter 36 to provide the rotor 28 with a balanced AC voltage, as represented by block 56. As discussed in detail below, the present DFIG 18 is configured to output three-phase power. As will be appreciated, alternative embodiments may employ DFIGs 18 configured to output 2, 3, 4, 5, 6, or more phase power. A three-phase AC signal includes three sinusoidal curves, each offset by 120 degrees. If the output is balanced, each phase may have substantially the same amplitude, frequency and offset. In addition, the frequency, amplitude and offset may remain substantially constant over time. As previously discussed, because the converter 36 is configured to convert the grid frequency into any suitable frequency for the rotor 28, the converter 36 may be capable of generating such a balanced signal.

Next, as represented by block 58, the controller 44 measures the current from the rotor 28. As previously discussed, the controller 44 is configured to measure current from the rotor 28 in order to properly operate the converter 36 during periods of power generation. Consequently, no additional connection or monitoring device may be employed outside of the controller 44 to properly measure rotor current in the diagnostic mode. The diagnostic mode of the controller 44 also includes instructions configured to analyze the current signal from the rotor 28 to identify winding faults. Specifically, the controller 44 determines whether the current from the rotor 28 is balanced, as represented by block 60. As discussed in detail below, an unbalanced signal may include variations in amplitude, frequency and/or offset between the phases. The diagnostic mode of the controller 44 may include instructions configured to compare the rotor current signal to the balanced signal from the converter 36 to identify winding faults. For example, if the amplitude, frequency and/or offset variations are greater than a desired tolerance a rotor fault may be detected, as represented by block 62.

The controller 44 may then measure the voltage output from the stator 30, as represented by block 64. Similar to detection of rotor winding faults, the controller 44 may determine whether the voltage from the stator 30 is balanced, as represented by block 66. If variations within the stator voltage are greater than a desired tolerance, a stator winding fault may be detected, as represented by block 68. In this manner, both stator winding faults and rotor winding faults may be detected by the controller 44 without any additional equipment or monitoring devices outside of the controller 44. Consequently, the present embodiment may provide a cost effective method for monitoring the DFIG 18, thereby facilitating more frequent testing of the rotor 28 and stator 30 compared to manual procedures. Therefore, the present embodiment may detect winding faults within the DFIG 18 earlier, thereby reducing the period of inefficient operation.

Figure 4:
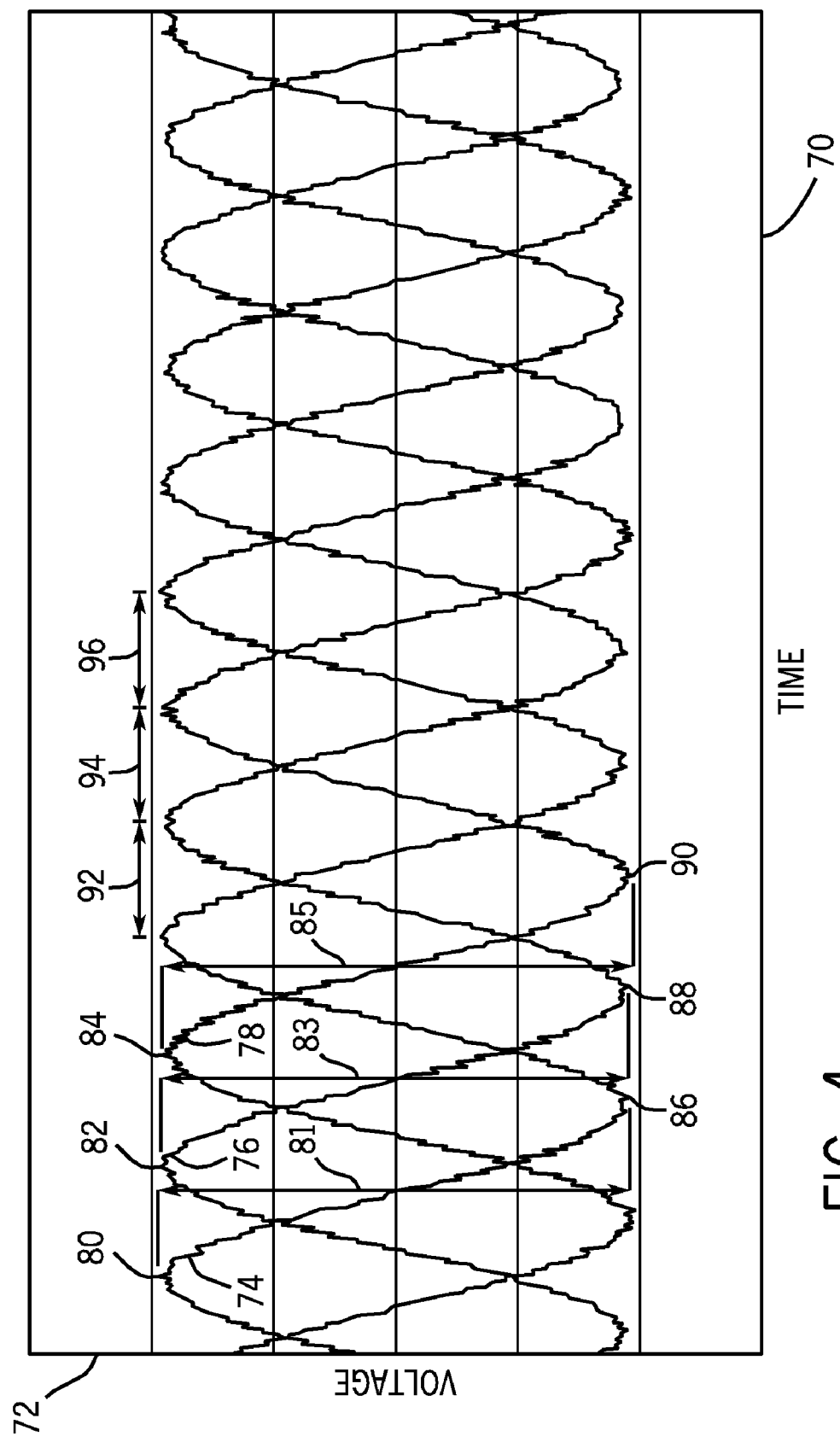
FIG. 4 is a graph of an exemplary input signal provided by the induction generator controller to the induction generator in accordance with certain embodiments of the present technique.

FIG. 4 is a graph of an exemplary input signal provided by the converter 36 to the DFIG 18. As previously discussed, the diagnostic mode of the controller 44 is configured to instruct the converter 36 to output a balanced AC signal to the rotor 28. While the present graph illustrates a three-phase signal suitable for a three-phase DFIG 18, alternative embodiments may utilize more or fewer phases based on the desired output from the wind turbine system 10. As illustrated, an x-axis 70 represents time, a y-axis 72 represents voltage, and curves 74, 76, and 78 represent phases within a three-phase input signal to the rotor 28. Specifically, the first phase 74, the second phase 76 and the third phase 78 illustrate a balanced AC voltage. As previously discussed, an AC signal is balanced when the amplitude, frequency and offset of each phase are substantially the same. Furthermore, in such a signal, the amplitude, frequency and offset of each phase remain substantially constant over time.

As illustrated, a peak 80 of the first phase 74, a peak 82 of the second phase 76, and a peak 84 of the third phase 78 occur at substantially the same voltage. Similarly, a trough 86 of the first phase 74, a trough 88 of the second phase 76, and a trough 90 of the third phase 78 occur at substantially the same voltage. Consequently, the peak-to-peak amplitude 81, 83 and 85 of each phase 74, 76 and 78, respectively, is substantially the same. Furthermore, because the peak voltage and trough voltage of each phase 74, 76 and 78 do not vary over time, the amplitudes 81, 83 and 85 remain substantially constant. In addition, an offset 92 between the first phase 74 and the second phase 76, an offset 94 between the second phase 76 and the third phase 78, and an offset 96 between the third phase 78 and the first phase 74 are substantially the same. As illustrated, the offsets 92, 94 and 96 remain substantially constant over time. Finally, the frequency of each phase 74, 76 and 78 are substantially the same, as illustrated. Consequently, the graph of FIG. 4 represents a balanced three-phase AC signal that may be sent from the converter 36 to the rotor 28 during the diagnostic mode. As previously discussed, the diagnostic mode of the controller 44 includes instructions configured to receive output signals from the rotor 28 and the stator 30, analyze the signals, and determine whether a winding fault is present within the rotor 28 and/or stator 30.

Figure 5:
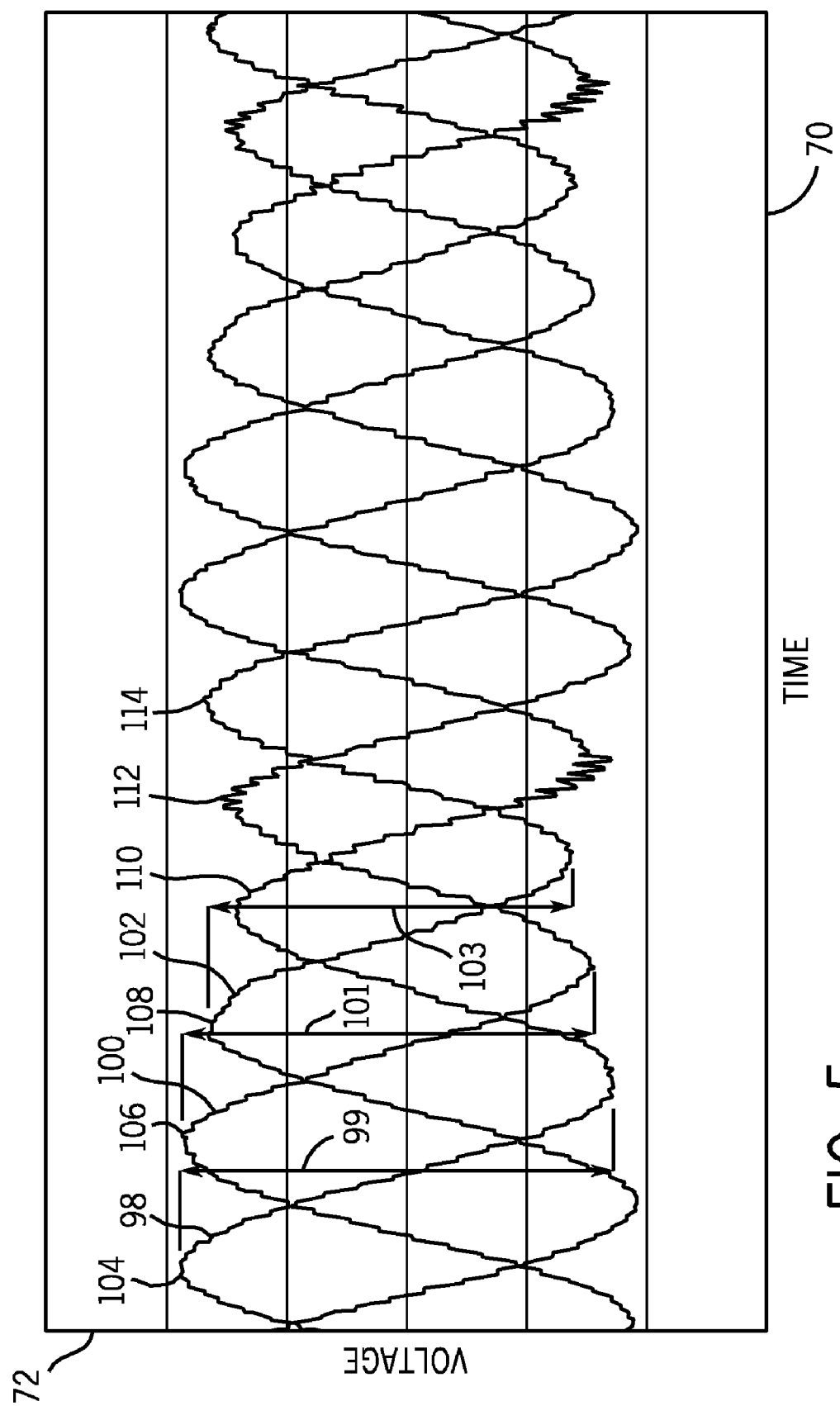
FIG. 5 is a graph of an exemplary output signal from a stator within the induction generator indicative of a stator winding fault in accordance with certain embodiments of the present technique.

FIG. 5 is a graph of an exemplary output signal from the stator 30 indicative of a stator winding fault. As will be appreciated, a current signal output from the rotor 28 may show similar indicia of a winding fault. As illustrated, the amplitude of each phase 98, 100 and 102 is not substantially the same, and the amplitude of each phase varies with time. Specifically, a peak 104 of the first phase 98, a peak 106 of the second phase 100, and a peak 108 of the third phase 102 do not occur at the same voltage. Consequently, the amplitudes 99, 101 and 103 of the phases 98, 100 and 102, respectively, are not substantially equal. Furthermore, a second peak 110 of the first phase 98 does not occur at the same voltage as the first peak 104. Similarly, a second peak 112 of the second phase 100 does not occur at the same voltage as the first peak 106, and a second peak 114 of the third phase 102 does not occur at the same voltage as the first peak 108. Therefore, the amplitudes 99, 101 and 103 of the phases 98, 100 and 102 vary with time. Because the amplitudes are different and vary with time, the illustrated output from the stator 30 is imbalanced. Consequently, if the controller 44 received such a signal from the stator 30, the controller 44 may report a winding fault to the computer 48. In certain embodiments, the computer 48 may display a plot similar to the illustrated graph so an operator may analyze the data and determine whether the fault is a turn fault or a ground fault, and on which phase or phases the fault is present. Such a configuration may facilitate rotor and/or stator fault detection without the addition of extra components within the wind turbine system 10 and/or manual inspection of the DFIG 18.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system comprising:
an induction generator including a rotor and a stator;
a converter electrically coupled to the induction generator and configured to regulate a flow of electrical power between the induction generator and an electrical grid; and a controller electrically coupled to the induction generator and the converter, wherein the controller is configured to operate the converter selectively in an electrical power generation mode and a diagnostic mode, and wherein the diagnostic mode of the controller is configured to instruct the converter to send an input signal to the rotor, receive an output signal from the rotor and the stator, and identify winding faults within the rotor, the stator, or a combination thereof, based on the output signals.

2. The system of claim 1, wherein the induction generator comprises a double-fed induction generator.

3. The system of claim 1, wherein the controller comprises a retrofit kit configured to enable the controller to operate the converter in the diagnostic mode.

4. The system of claim 1, comprising a wind turbine including the induction generator.

5. The system of claim 1, wherein the input signal comprises a balanced alternating current (AC) voltage, and wherein the rotor output signal comprises an AC current.

6. The system of claim 5, wherein the diagnostic mode of the controller is configured to identify winding faults within the rotor based on detection of a current imbalance within the output signal of the rotor.

7. The system of claim 1, wherein the input signal comprises a balanced AC voltage, and wherein the stator output signal comprises an AC voltage.

8. The system of claim 7, wherein the diagnostic mode of the controller is configured to identify winding faults within the stator based on detection of a voltage imbalance within the output signal of the stator.

9. A system comprising:

an induction generator controller configured to operate an induction generator via a converter in an electrical power generation mode and a diagnostic mode, wherein the diagnostic mode is configured to instruct the converter to send an input signal to a rotor of the induction generator, receive an output signal from the rotor and a stator of the induction generator, and identify winding faults within the rotor, the stator, or a combination thereof, based on the output signals.

10. The system of claim 9, wherein the diagnostic mode of the induction generator controller is configured to disconnect the induction generator from an electrical grid prior to instructing the converter to send the input signal.

11. The system of claim 9, comprising a wind turbine including the induction generator controller, wherein the induction generator controller is communicatively coupled to a data processing unit remote from the wind turbine.

12. The system of claim 9, wherein the input signal comprises a balanced alternating current (AC) voltage.

13. The system of claim 9, wherein the diagnostic mode of the induction generator controller is configured to identify winding faults within the rotor based on detection of a current imbalance within the output signal of the rotor.

14. The system of claim 9, wherein the diagnostic mode of the induction generator controller is configured to identify winding faults within the stator based on detection of a voltage imbalance within the output signal of the stator.

15. The system of claim 9, wherein the induction generator comprises a double-fed induction generator.

* * * * *